(12) United States Patent
Tsai et al.

(10) Patent No.: US 6,486,079 B2
(45) Date of Patent: Nov. 26, 2002

(54) METHOD FOR STABILIZING LOW DIELECTRIC CONSTANT MATERIALS

(75) Inventors: Cheng-Yuan Tsai, Yun-Lin; Yung-Tsung Wei, Pai-Ho Chen; Teng-Chun Tsai; Ming-Sheng Yang, both of Hsin-Chu, all of (TW)

(73) Assignee: United Microelectronics Corp., Hsin-Chu City (TW)

( * ) Notice: Subject to any disclaimer, the term of this patent is extended or adjusted under 35 U.S.C. 154(b) by 0 days.

(21) Appl. No.: 09/790,192

(22) Filed: Feb. 21, 2001

(65) Prior Publication Data

US 2002/0115305 A1 Aug. 22, 2002

(51) Int. Cl.⁷ .................. H01L 21/31; H01L 21/469
(52) U.S. Cl. .......................... 438/781; 438/782
(58) Field of Search ................. 438/780, 781, 438/782

(56) References Cited

U.S. PATENT DOCUMENTS

| | | | | |
|---|---|---|---|---|
| 6,114,254 A | * | 9/2000 | Rolfson | 438/758 |
| 6,140,254 A | * | 10/2000 | Endisch et al. | 438/787 |

* cited by examiner

*Primary Examiner*—Alexander Ghyka
(74) *Attorney, Agent, or Firm*—Powell, Goldstein, Frazer & Murphy LLP

(57) ABSTRACT

The present invention provides a method for stabilizing low dielectric constant materials in a semiconductor structure. The method comprises providing the semiconductor structure and thereon spinning-on a dielectric layer. After a curing step, the dielectric layer is treated with an aqueous solution containing, for example, ammonium hydroxide. With the aqueous solution, a passivated film formed on the surface of the dielectric layer, such as a polymer layer, can protect the dielectric layer from adsorption of moisture or solvents.

12 Claims, 4 Drawing Sheets

| | C(1s), 2 σ | O(1s), 2 σ |
|---|---|---|
| Untreated | 98.0% | 1.7% |
| After AMAT | 96.6% | 3.2% |

TABLE.1

METHOD FOR STABILIZING LOW DIELECTRIC CONSTANT MATERIALS

BACKGROUND OF THE INVENTION

1. Field of the Invention

The invention relates to a method for stabilizing low dielectric constant materials, and more particularly to a method for stabilizing spin on polymer materials.

2. Description of the Prior Art

It is the nature of semiconductor physics that as the feature sizes are scaled down, the performance of internal devices in integrated circuits improves in a compounded fashion. That is, the device speed as well as the functional capability improves. The overall circuit speed, however, becomes more dependent upon the propagation speed of the signals along the interconnects that connect the various devices together. With the advent of very and ultra large scale integration (VLSI and ULSI) circuits, it has therefore become even more important that the metal conductors that form the interconnections between devices as well as between circuits in a semiconductor have low resistivities for high signal propagation. Copper is often preferred for its low resistivity, as well as for resistance to electromigration and stress voiding properties.

On the other hand, considerable attention has focused on the replacement of silicon dioxide with new materials, particular material having lower dielectric constants, since both capacitive delays and power consumption depend on the dielectric constant of the insulator. Accordingly, circuit performance enhancement has been sought by combining the copper conductors with low dielectric constant layer (k less than approximately 4).

Spin on polymer, for example, aromatic hydrocarbon material contained or SiLK, has been used recently as a low dielectric constant material. Those spin on polymers mostly have hydrophobic behavior after a curing step. For the hydrophobic nature of the polymers, they have the tendency to chemically protect moisture or solvents on their surface. Even so, the physical absorption on a film's surface is still observed from environments. The absorption phenomena would result in degradation of the characteristics of the polymers, such as an increase of the dielectric constant. Depicted in FIG. 1, the value of the dielectric constant changes with respect to the exposure time of the polymers. The result clearly indicates that the dielectric constant gradually increases with the exposure time after the curing step. On the other hand, the moisture or solvents may be removed by using a baking or degassing step. However, the polymers have loose structures that may result in re-adsorption phenomena when the polymers are again exposed for a long time.

SUMMARY OF THE INVENTION

One of the objectives of the present invention is to provide a method to stabilize low dielectric constant materials. Formation of a passivated film on the low dielectric constant materials can protect them from adsorption of moisture or solvents after the curing step.

Another one of the objectives of the present invention is to provide a method to stabilize spin on polymer materials. The surfaces of the spin on polymer materials are treated with alkaline solution.

In the present invention, a method for stabilizing low dielectric constant materials in a semiconductor structure is disclosed. The method comprises providing the semiconductor structure and thereon spinning-on a dielectric layer. After a curing step, the dielectric layer is treated with an aqueous solution containing ammonium hydroxide. With the aqueous solution, a passivated film formed from the surface of the dielectric layer, such as a polymer layer, can protect the dielectric layer from adsorption of moisture or solvents.

BRIEF DESCRIPTION OF THE DRAWINGS

A better understanding of the invention may be derived by reading the following detailed description with reference to the accompanying drawings wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

In the present invention, a method for forming a passivated film from a low dielectric constant layer in a semiconductor structure comprises providing the semiconductor structure and thereon spinning-on a polymer layer. Next, the polymer layer is cured and then the passivated film is formed from the polymer layer. The passivated film can protect the polymer layer from adsorption of moisture and solvents.

Figure 1:
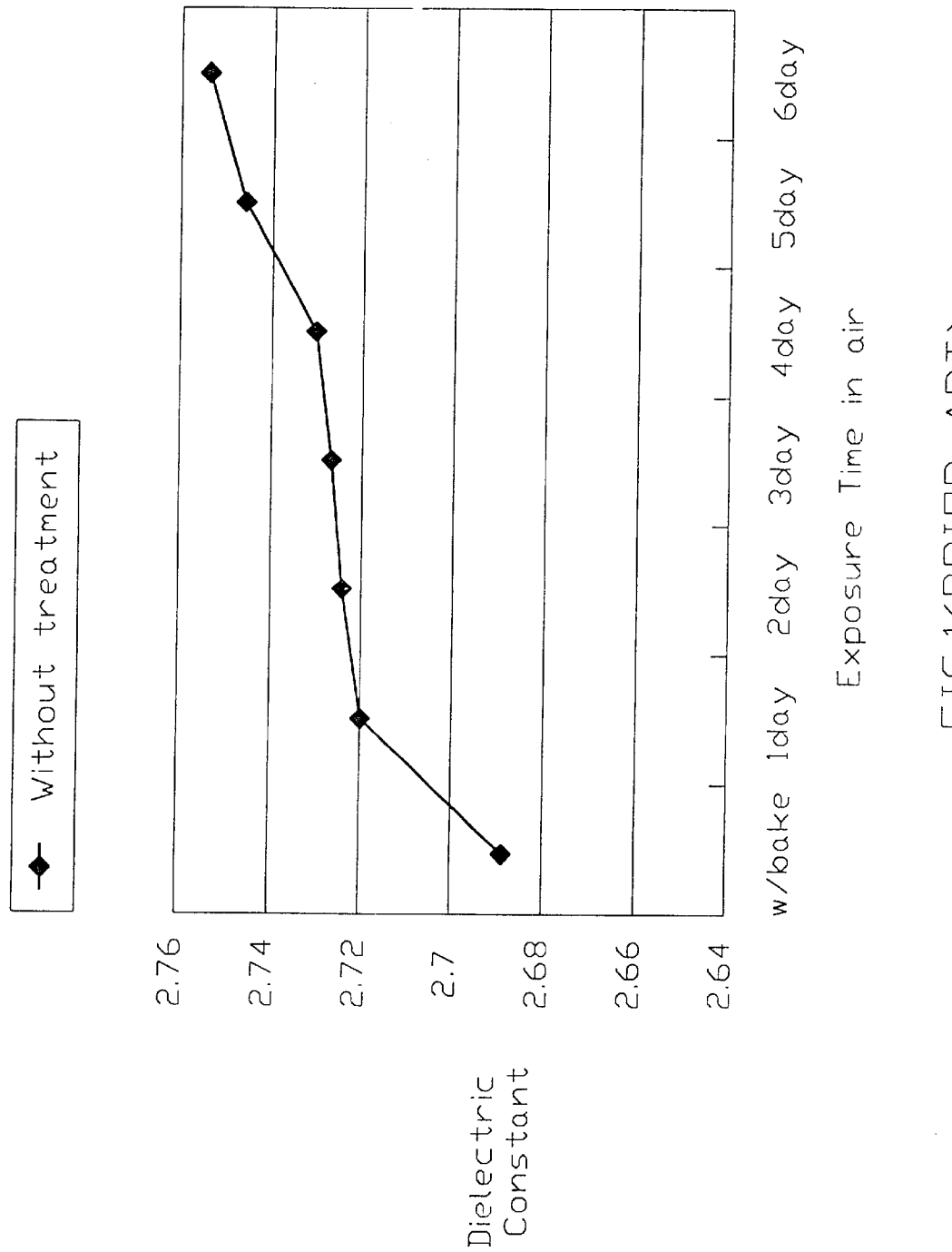
FIG. 1 is a diagram for the profile of the dielectric constant of the spin on polymer material with respect to the exposure time in air in accordance with the prior art.
Figure 2:
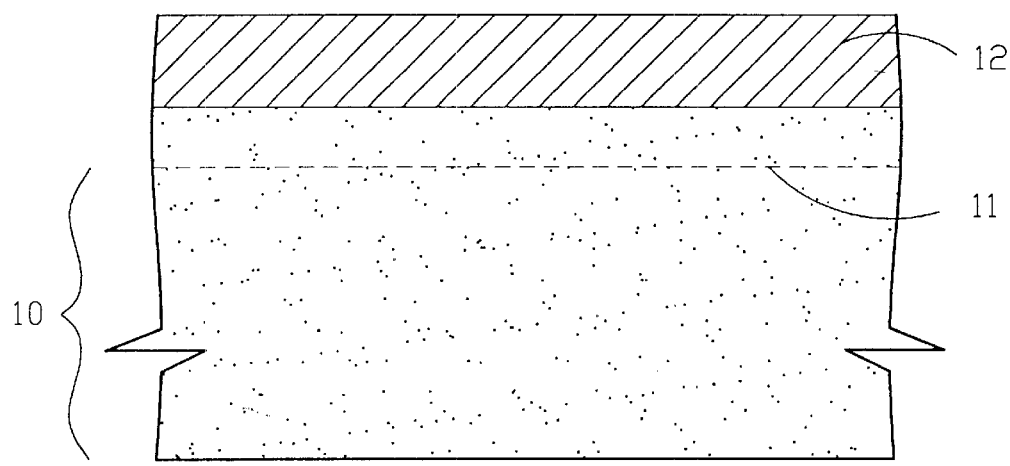
FIG. 2 is a cross-sectional schematic diagram illustrating the formation of the passivated film in accordance with the present invention.

An embodiment of the present invention is depicted in FIG. 2, which show a cross-section of a semiconductor structure. A polymer layer 10, such as containing aromatic hydrocarbon materials, is blanket spun on a semiconductor structure (not shown), such as a multi-level interconnect structure. Then the polymer layer 10 is accomplished by a curing step. Before deposition of a hardmask 12, the surface of the polymer layer 10 is treated with alkaline solution containing amine/ammonium hydroxide compounds. The purpose of treatment of the alkaline solution is to form a stably passivated film on the surface of the polymer layer 10, as a dash line 11 representing the region of the passivated film.

Such treatment may be referred to as anti-moisture adsorption treatment (AMAT) because it can protect the polymer layer 10 from adsorption of moisture or solvents.

To be specific, the passivated film is so thin (a thickness less than 100 Angstroms, from X-ray photoelectron spectrometry, XPS) that it has little influence on the increase of the dielectric constant. Based on a series of experiments and observations, the dielectric constant of the polymer layer 10 can be stably remain low for a long time (about 2.71 after exposed in air over a month). For the anti-moisture adsorption treatment, the hydroxide ions in the solution can oxidize the: surface of the polymer layer 10 to form a passivated film. A film containing carbonyl groups (C=O) therein may be formed by oxidation of the AMAT. The formation of carbonyl groups result from oxidation of ether groups probably contained in the polymer layer 10. Generally, the composition of oxygen atoms on the surface in polymer layer 10 are about 2%. On the other hand, listed in TABLE 1, after AMAT, the oxygen atoms on polymer surface are slightly increased, about 3%, based on X-ray photoelectron spectrometry (XPS) measurement. That is, even the formation of carbonyl groups by the AMAT also does not cause too much of an increase on the dielectric constant of the polymer layer 10. After the AMAT treatment, the hardmask 12 is deposited on the polymer layer 10 by the method of plasma enhanced chemical vapor deposition (PECVD) for incoming steps without additional bake or degassing step incorporation.

To be specific, the formation of the passivated film is also advantageous for the deposition of the hard mask 12. Conventionally, a baking treatment may be added prior to the PECVD step of the hardmask 12 for removal of residual solvents in the polymer layer 10. The residual moistures and/or solvents in the polymer layer 10 do not have enough time to escape from the surface of the polymer layer 10, which may cause formation of bubbles/peeling in the structure of the polymer layer 10 during the PECVD step. The formation of the bubbles/peeling may degrade the properties of the semiconductor structure.

Figure 3:
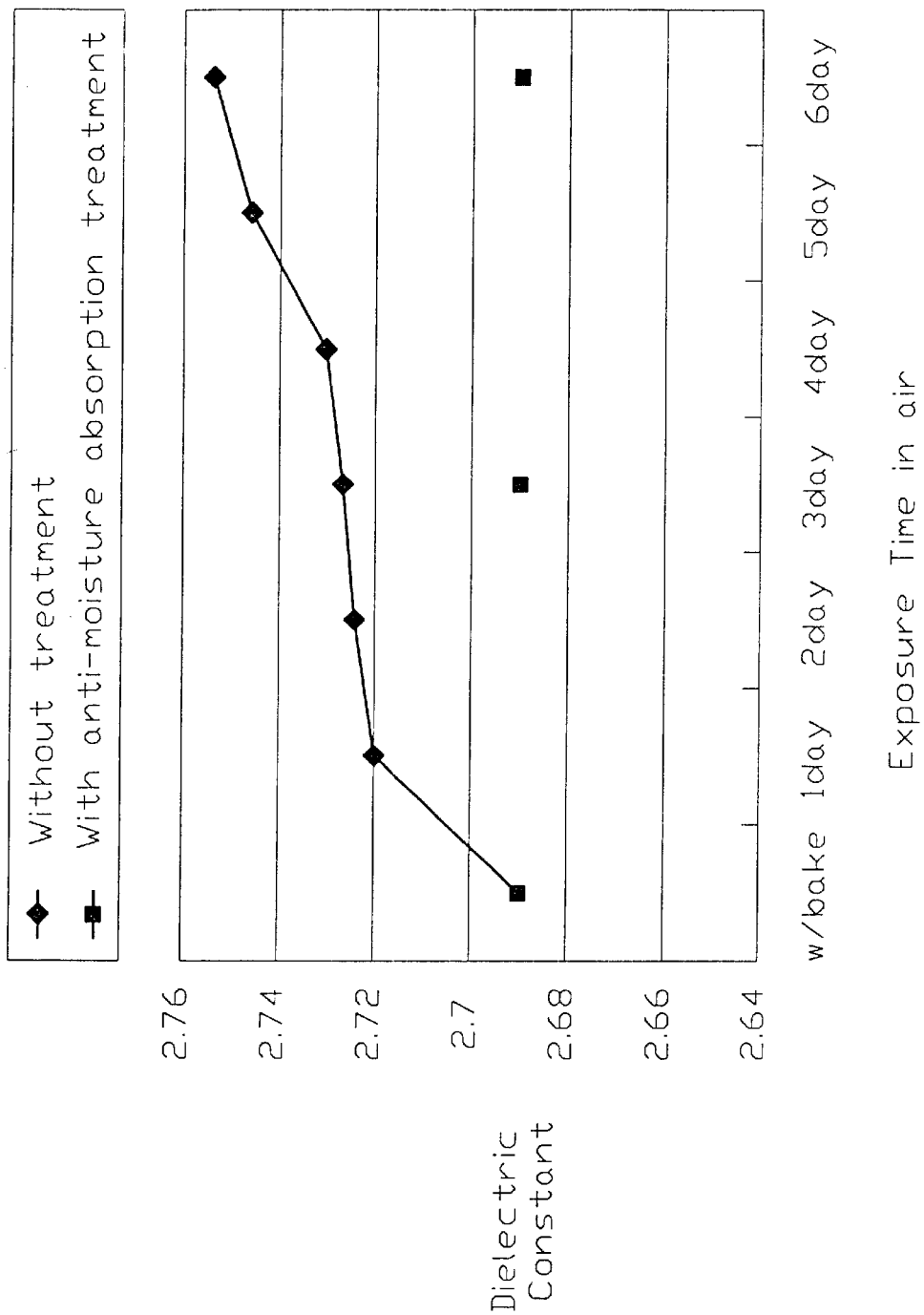
FIG. 3 is a diagram for the profile of the dielectric constant of the spin on polymer material with respect to the exposure time in air in accordance with the present invention compared with the prior art; and Table 1 illustrates surface atomic composition of a polymer determined by XPS with respect to the present invention compared with the prior art.

FIG. 3 shows the value of the dielectric constant versus the exposure time. Compared with one without the AMAT treatment, the surface treated by the present invention remains stable with unchangeable values of the dielectric constant for a long time. That is, the passivated film on the surface of the polymer layer can protect the spin on polymer layer from further adsorption of moisture or solvents.

One of the objectives of the present invention is to provide a better method for degassing and moisture desorption of the spin on polymer materials. The formation of the passivated layer can replace or shorten the baking step/time, so the present invention can be applied on the replacement of all the baking step for the degassing and moisture desorption.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for stabilizing low dielectric constant materials in a semiconductor structure, said method comprising:

providing said semiconductor structure;

spinning-on a dielectric layer on said semiconductor structure; and treating said dielectric layer with an aqueous solution to form a passivated film over said dielectric layer, said aqueous solution comprising an amine compound.

2. The method according to claim 1 further comprising curing said dielectric layer after said treating step.

3. The method according to claim 1, wherein said passivated film has a thickness less than 100 angstroms.

4. The method according to claim 1, wherein said passivated film comprises an oxide film.

5. The method according to claim 1, wherein said aqueous solution comprises an ammonium hydroxide compound.

6. The method according to claim 1, wherein said dielectric layer comprises a spin on polymer.

7. A method for forming a passivated film from a polymer layer with a low dielectric constant in a semiconductor structure, said method comprising;

providing said semiconductor structure;

spinning-on said polymer layer on said semiconductor structure;

curing said polymer layer; and forming said passivated film from said cured polymer layer, said forming step accomplished by treating a surface of said polymer layer with an alkaline solution contained a compound of amine therein.

8. The method according to claim 7, wherein said forming step is accomplished by treating a surface of said polymer layer with an aqueous solution contained a compound of ammonium hydroxide therein.

9. The method according to claim 7, wherein said polymer layer is made by an aromatic hydrocarbon material.

10. The method according to claim 7, wherein said passivated film comprises an oxide film.

11. The method according to claim 7, wherein said passivated film comprises a compound contained a carbonyl group.

12. A method for forming a passivated film from a polymer layer with a low dielectric constant in a semiconductor structure, said method comprising:

providing said semiconductor structure;

spinning-on said polymer layer on said semiconductor structure;

curing said polymer layer; and forming said passivated film from said cured polymer layer, said forming step accomplished by treating a surface of said polymer layer with an alkaline solution contained a compound of ammonium hydroxide.

* * * * *